US010495688B1

(12) United States Patent
Lopez et al.

(10) Patent No.: US 10,495,688 B1
(45) Date of Patent: Dec. 3, 2019

(54) MANUAL TEST SOCKET AND METHOD OF ADJUSTMENT

(71) Applicant: JohnsTech International Corporation, Minneapolis, MN (US)

(72) Inventors: Jose Lopez, Sunnyvale, CA (US); Mehdi Attaran, Murrieta, CA (US)

(73) Assignee: Johnstech International Corporation, Minneapolis, MN (US)

( * ) Notice: Subject to any disclaimer, the term of this patent is extended or adjusted under 35 U.S.C. 154(b) by 253 days.

(21) Appl. No.: 15/493,740

(22) Filed: Apr. 21, 2017

Related U.S. Application Data (60) Provisional application No. 62/327,701, filed on Apr. 26, 2016.

(51) Int. Cl.
*G01R 31/28* (2006.01)
(52) U.S. Cl.
CPC ................ *G01R 31/2891* (2013.01)
(58) Field of Classification Search
CPC ................................. G01R 31/2891
See application file for complete search history.

(56) References Cited

U.S. PATENT DOCUMENTS

| 5,295,853 | A | * | 3/1994 | Nagakusa | G01R 31/2808 |
|---|---|---|---|---|---|
| | | | | | 324/750.25 |
| 7,202,657 | B2 | | 4/2007 | Shell | |
| 8,536,889 | B2 | | 9/2013 | Nelson et al. | |
| 8,558,554 | B2 | | 10/2013 | Erdman et al. | |
| 2010/0295572 | A1 | * | 11/2010 | Ryu | G01R 1/0483 |
| | | | | | 324/765.01 |
| 2012/0142210 | A1 | * | 6/2012 | Di Stefano | H01R 4/48 |
| | | | | | 439/374 |
| 2015/0192610 | A1 | * | 7/2015 | Tang | G01R 1/0491 |
| | | | | | 324/756.02 |
| 2016/0041202 | A1 | * | 2/2016 | Peng | G01R 1/44 |
| | | | | | 324/750.11 |
| 2017/0146566 | A1 | * | 5/2017 | Eldridge | G01R 1/0441 |

* cited by examiner

*Primary Examiner* — Patrick Assouad
*Assistant Examiner* — Feba Pothen
(74) *Attorney, Agent, or Firm* — Hamre, Schumann, Mueller & Larson, P.C.

(57) ABSTRACT

A test device for manually testing chips/ICs is disclosed. A housing includes a receiver for a device under test (DUT). The DUT must be pressed into the housing to make adequate contact with the test pins in the bottom of the test device. A screw drive presses the DUT into position and a plurality of holes in the turning knob accommodate through-going pins which on one leg extend through the knob and into an interference path of a fixed barrier stop. The extended leg then engages the stop during rotation to end the downward movement of the screw. Adjustment is made by selecting holes where the pins are inserted. Reversing the pins in the hole allows for storage of the pins when not in use.

14 Claims, 6 Drawing Sheets

MANUAL TEST SOCKET AND METHOD OF ADJUSTMENT

TECHNICAL FIELD

This disclosure relates to the field of microcircuit/IC testing devices, more particularly, a manual test socket/actuator used to manually test single chips.

BACKGROUND

Microcircuits are well known electrical components that combine hundreds or thousands of individual circuit components and connections in a small volume. The package that holds a typical microcircuit may be no larger than 5 mm. square by 0.5 mm thick. One common type of container for a microcircuit called a leadless package, has small connector or contact pads along the periphery of one surface of the package. A single package may have several dozen contact pads by which power is supplied to the microcircuits and signals sent to and from the microcircuit. The contact pads are soldered onto the conductors of a circuit board during assembly of the electrical device.

Before a microcircuit is soldered onto a circuit board, the microcircuit must be tested to assure design functionality. Soldering a defective microcircuit onto a circuit board often ruins the entire board, since typically it is either not possible or not economic to remove a defective microcircuit from a circuit board. Since typical microcircuits are the result of a complex manufacturing process, testing is essential to assure that every microcircuit is completely functional.

For a number of reasons, testing these microcircuits is complex. In the first place, one should not solder the microcircuits to be tested into the test fixture because the act of removing the microcircuits when testing is complete might itself damage the microcircuit.

Secondly, the microcircuits are small and the contacts are closely spaced, on perhaps as small as a 0.1 mm pitch. The contacts themselves may be as small as 0.05 mm wide. For accurate testing, the test fixture contacts must make reliable, low-resistance contact with each of the microcircuit contacts during the entire test process, which may extend to even many hours. Failure to make proper contact with each microcircuit pin/contact may result in a failed test even if the microcircuit is not defective or a passed test for a bad chip.

While it is important to test each microcircuit thoroughly, it is also important to test them quickly and cheaply. Accordingly, automated testers have been developed that operate with little human intervention to reliably test hundreds or thousands of individual microcircuits per hour.

A typical tester has its own circuit board with one or more arrays of test contacts that are spaced and aligned to make temporary mechanical contact with the connector pads on the microcircuit package. Each test socket contact is designed to resiliently deflect a very small amount when force is applied. This accommodates any dimensional variations in either the microcircuit package or the test socket contacts.

An alignment plate is mounted on the tester circuit board with an aperture that receives and precisely positions each microcircuit to be tested so that each of the microcircuit contact pads is in precise alignment with the corresponding test contact. The alignment plate is typically bolted to the contactor which is mounted to tester circuit board.

To assure reliable and low resistance electrical conduction between each test socket contact and the corresponding microcircuit contact, the tester includes a presser or loader element that applies sufficient force to the microcircuit package so that each of the microcircuit package contacts at least slightly deflects the corresponding test socket contact. For example, if the test procedure requires 50 grams of force between each package contact and each tester contact, a package with 100 contacts will then require 5 kg. of force for proper electrical connection between each of the microcircuit contacts and the corresponding tester contact. It is not at all convenient to manually apply such a force for the entire duration of a longer test.

Two temporary situations arise where automated robotic force application to the microcircuit during testing is not convenient. One of these situations is where a tester fails more than the expected percentage of microcircuits, where the tester is inconsistent in testing the same microcircuit or early in the production cycle where only a few chips need to be tested to build prototypes. In either case the tester itself must be tested or repaired.

The second situation is when a tester is being first set up for testing a particular microcircuit. During either of these situations, it is necessary for the entire duration of the test to consistently apply the appropriate force to the package to create the required force between the microcircuit contacts and the tester contacts. We find in these circumstances that using the tester loader element is inconvenient and applying force by hand to the package insufficiently precise and very difficult.

Accordingly, a mechanism for temporarily applying a consistent force to press a microcircuit against tester contacts is needed. Such a tester is referred to as manual test socket or actuator. One such device is disclosed in U.S. Pat. No. 7,202,657 to Shell, which is incorporated herein by reference.

Prior art manual test sockets suffer from the difficulty of applying the right amount of force on the device under test (DUT) and then applying the same force consistently from DUT to DUT.

BRIEF SUMMARY

The following a summary intended to assist the reader in understanding some aspects of the disclosure. It does not define the scope of the invention. Please refer to the claims for that.

The disclosure includes a manually force adjustable integrated circuit tester for providing a force against a device under test (DUT) and a plurality of test pins for engaging contacts on the DUT, the tester having any or all of the following:

a) a frame, said frame having a receiver sized to receive a DUT and a bottom surface against which the DUT is pressed, said bottom surface having said contacts;

b) a screw fed driver having a top toward its upper end and an engagement surface at its bottom end, the engagement surface configured to engage said DUT, c) a stop barrier operatively connected to the housing and located adjacent said knob;

d) said knob having an outer circumference and top surface, said top surface including a plurality of hole pairs at least one of which extending through the knob;

e) at least one pin having two spaced apart legs, said legs being spaced such that the pin can fit into a hole pair; the pin having a first longer leg long enough to extend through and beyond said knob; so that when said knob is rotated, the longer pin follows a circumferential path under said knob;

f) said stop barrier being located to engage said longer pin in said through hole along said when said knob is rotated and said longer pins follows said path; thereby creating a stop engagement between said longer pin and said stop and thereby defining the maximum pressure on said DUT.

The disclosure further includes wherein said pin hole pairs are arranged in a path in said top of said knob forming concentric rings of holes, only the outer one aligned to interfere with said stop.

The disclosure further includes wherein said pins include a bend joining said legs.

The disclosure further includes wherein said pin legs are parallel.

The disclosure further includes wherein said pin legs are non-parallel to provide positive engagement with said holes.

The disclosure further includes wherein said pins include pins of different diameters, less than diameter of said holes.

The disclosure further includes wherein said stop barrier is movable.

The disclosure further includes wherein said housing includes a top portion removable from a bottom portion, said top portion including the screw drive and a pair of engagement arm which latch onto said bottom portion.

The disclosure further includes a method of setting the engagement pressure on a manually force adjustable integrated circuit tester for providing a force between screw driven element with a knob, driving a device under test (DUT) and housing floor having a plurality of test pins for engaging contacts on the DUT, having a plurality of through holes, at least one pin sized to be received within said holes, a stop barrier under said knob comprising any or all of the steps, in any order of: inserting said pin in one of said holes such that said pin extends sufficiently that it will contact said stop barrier when said knob is rotated; turning the knob to engage said stop barrier; testing the electrical contact between the DUT and pins; calibrating the tester by: decreasing the contact pressure by turning the knob in a pressure releasing direction and simultaneously testing the electrical contact until it is no longer reliable. Reliability is determined by electrical testing of the DUT to pin resistance, or impedance, or stability or other factors as the user may decide. Increasing the contact pressure to at least a point of reliability. Inserting said pin in a hole adjacent said stop so that a reliable pressure is set.

It is also possible to determine the absolute maximum pressure by inserting a pressure sensor between the DUT and screw during calibration/set up and applying the maximum predetermined (specification) pressure and decreasing from there. The preferred pressure will be between the minimum reliable and maximum specification pressure.

Many other features and combinations are disclosed and claimed.

DETAILED DESCRIPTION

Figure 1:
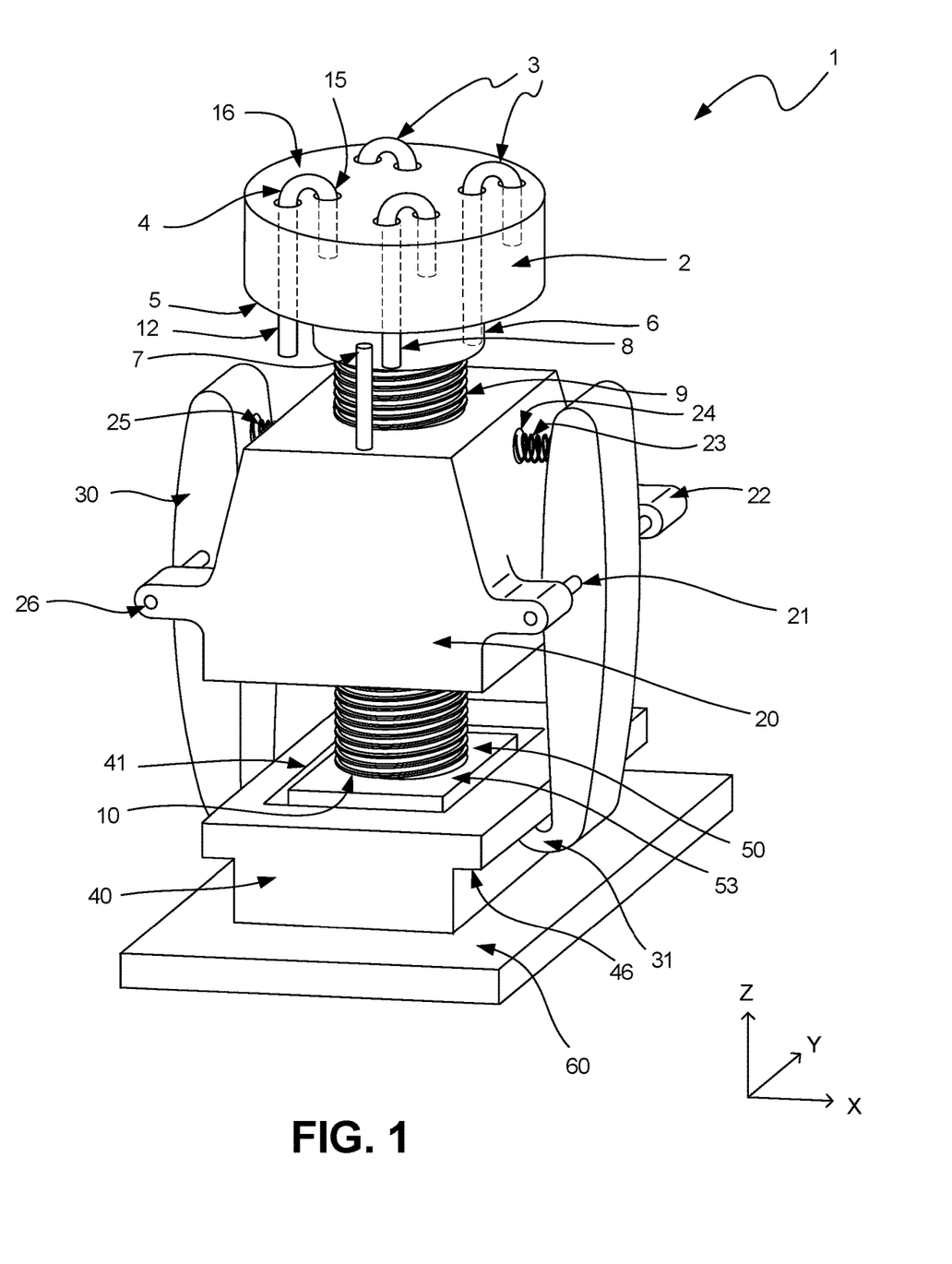
FIG. 1 is a perspective view of one embodiment of a tester.
Figure 2:
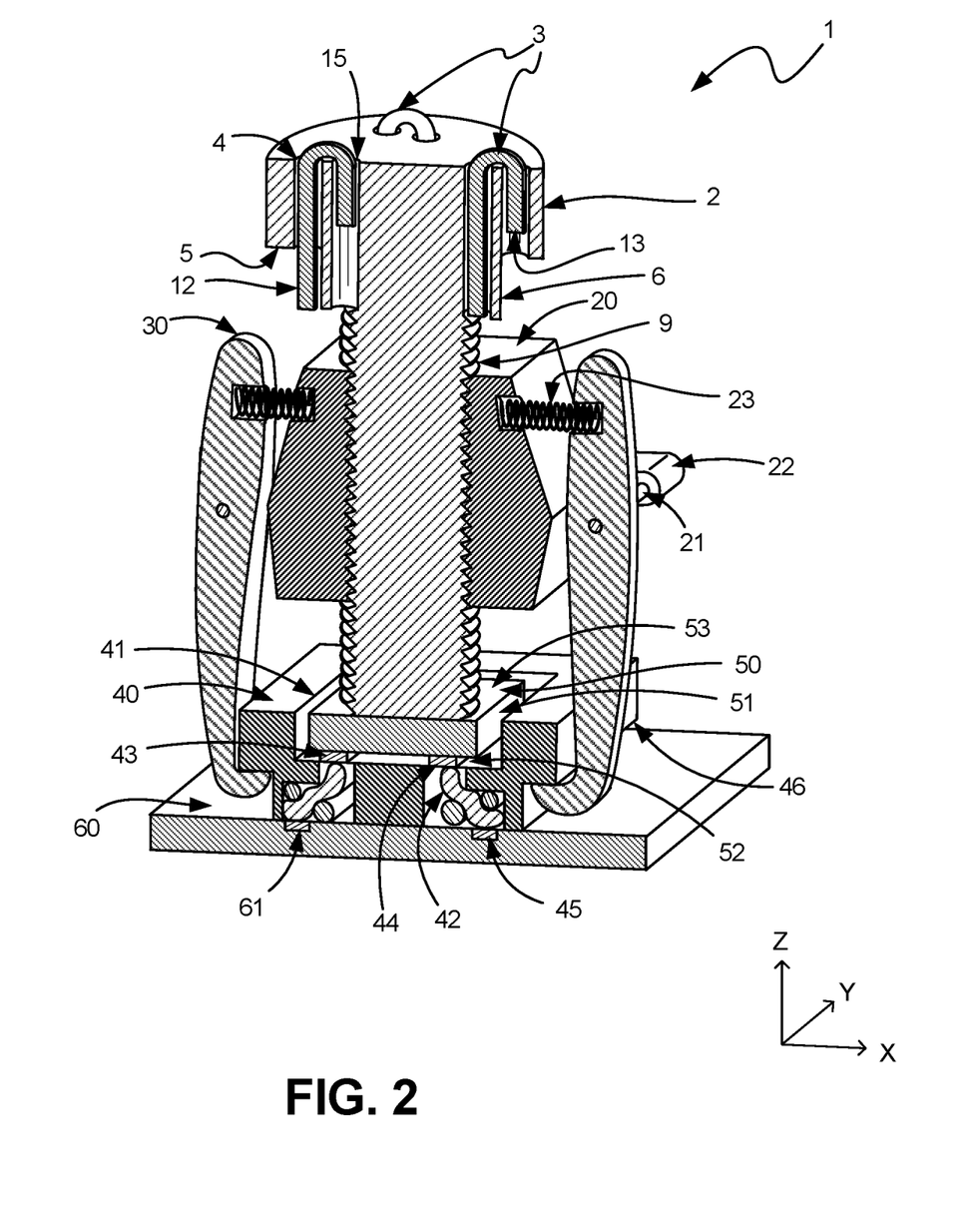
FIG. 2 is a sectional view of FIG. 1.
Figure 3:
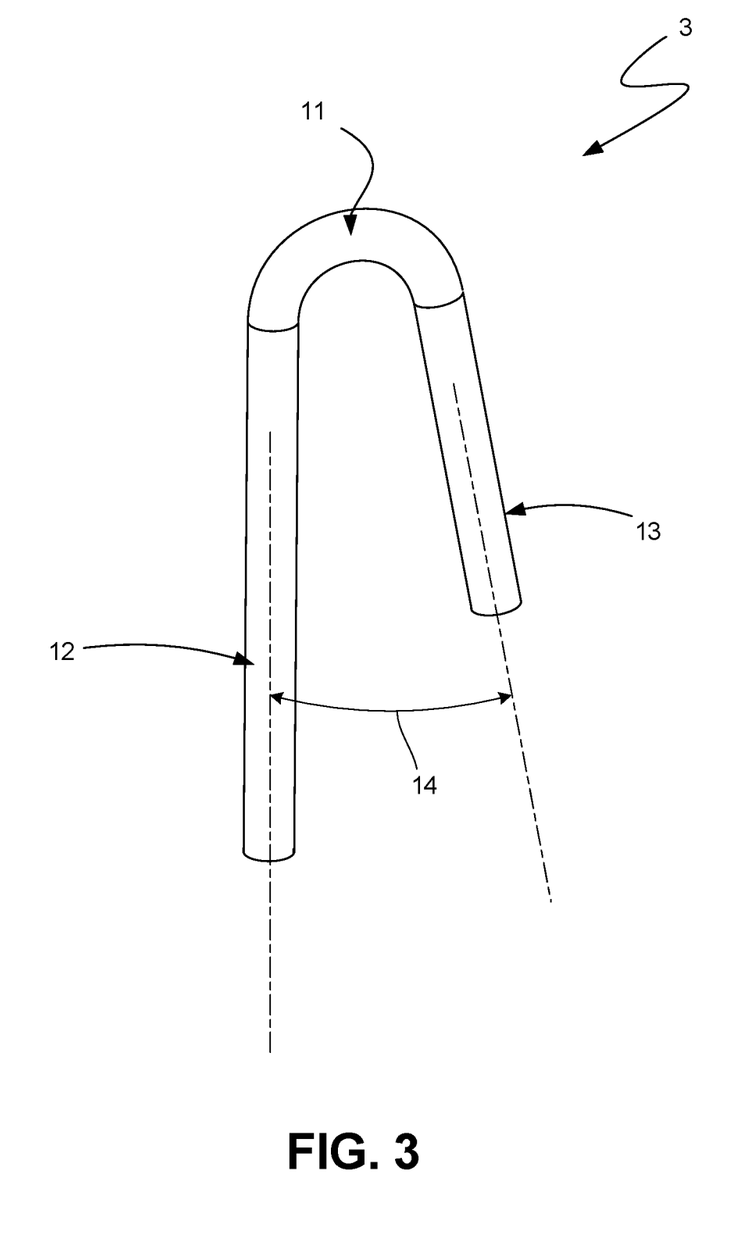
FIG. 3 is a close up perspective view of a pin 13.
Figure 4:
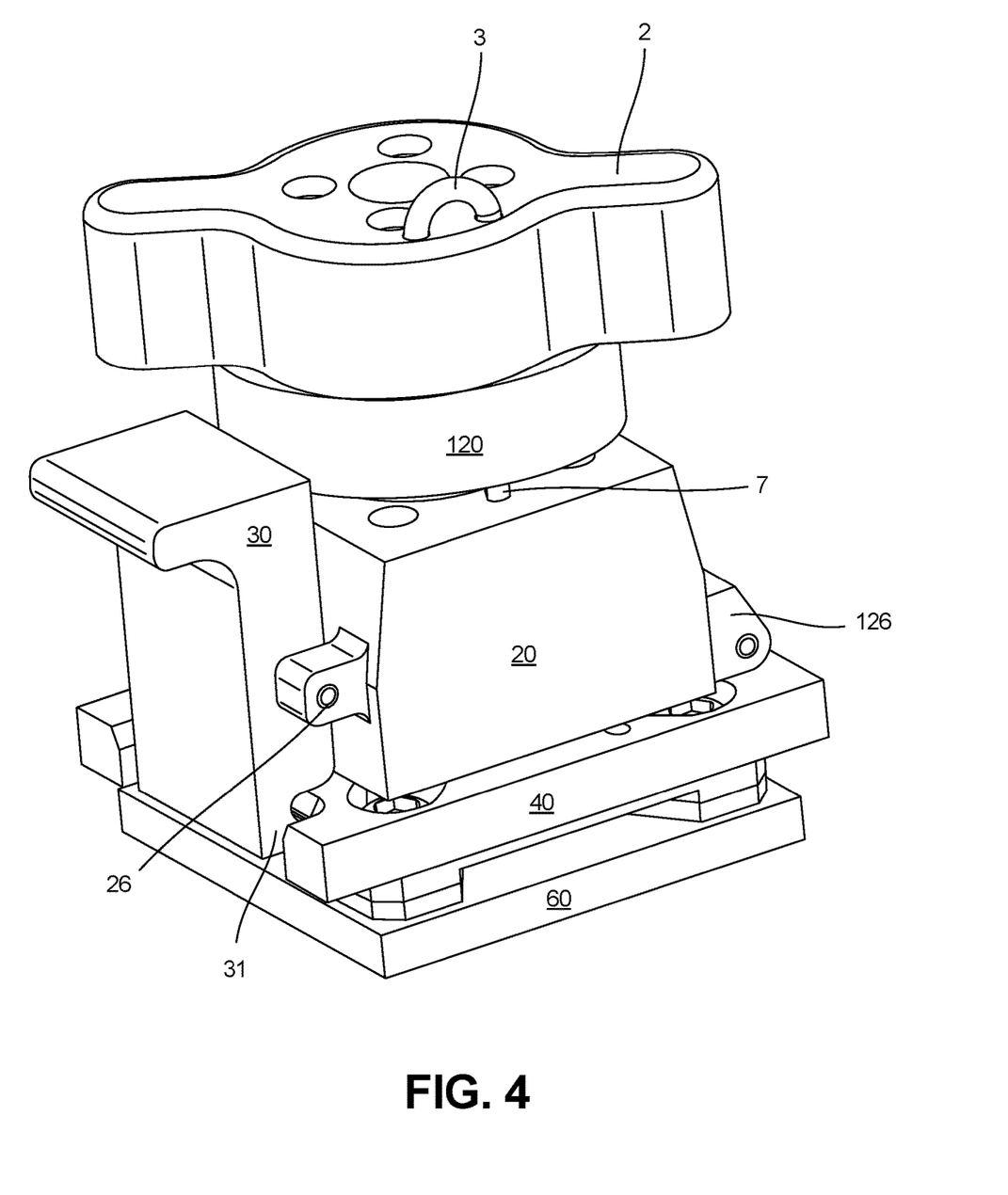
FIG. 4 is a view like FIG. 1 but of an alternative embodiment.

FIG. 1 and FIG. 2 are the preferred embodiments. FIG. 1 is an overall view of the assembly. FIG. 2 is the section view of the same assembly. FIG. 3 is an illustration of the "J-shaped" bent stop wire. FIG. 4 is an alternative embodiment.

To perform these connections reliably with consistent contact resistance from the IC device (DUT) pad 52 to the circuit board trace/pad 61 on the load board 60, the IC device/DUT 50 must be presented onto conductive elements 42 (contact pins of types known in the art, such as shown in U.S. Pat. Nos. 8,536,889 and 8,558,554, incorporated herein by reference) in a very accurate position both above the test socket housing 40 (Z-axis) and in the lateral directions (X-axis and Y-axis). This lateral direction control is usually achieved by limiting the device sidewalls 51 X and Y-play to within an alignment window frame 41 at the top opening of the housing. As an example, for a square shaped profile device 50 a square shaped window 41 on top of the housing 40 that is slightly wider than the DUT 50 is provided to align the device 50 over the conductive elements 42. The housing includes contact pins, not shown but known in the art such as in the cited references. The upper part of the test includes most everything other than the base.

The DUT 50 positional control along the Z-axis is usually achieved by tip/end 10 threaded screw member 9 pushing on the backside 53 of the device/DUT 50 onto a flat surface on the floor 43 of the housing 40. Other methods of applying pressure besides screw drive are possible such as levers or pawls. For example, the same square shaped device 50 will have a specific thickness wherein a thread member 9 must position it to press the device 50 onto the housing's 40 floor surface 43 to make contact with the conductive elements.

To be able to reliably and repeatedly apply the same amount of pressure against the DUT, the preferred embodiment includes an adjustable stop limit mechanism to prevent over pressure once set to the desire position.

This thread member 9 ideally will preferably have a rotational stop limit pin/post/flange/barrier 12 to accurately Z-position the device 50 and thereby provide a consistent position and clamping force. If this force is not sufficient and consistent the resulting test results of the device 50 will deviate from test-to-test or from device-to-device. Some devices are so electrically sensitive that the stop limit design must have relatively small Z-increments that can be fine-tuned to the Z-location that results in a reliable and consistent test result. Once the appropriate stop limit is determined, insertion of the pin at the stop barrier (and/or other adjustments) now establishes the preferred pressure for future DUTs.

Other methods of rotational adjustment involve the removal and reinstallation of multiple screws to reposition the knob. The method of finely adjusting the rotational stop of the knob provides a low manufacturing cost, convenient, easy to use, easily retained removable option, and additionally the option to expediently re-implement even if components are lost. The other benefits are essential in the demanding operational requirements of semiconductor test or any other similar operation requiring these features.

The manual actuator assembly 1 is to provide an accurate and consistent Z-position and push force by the thread member 9 onto the device 50 so the underside leads 52 make reliable contact with the generally conductive elements 42 of the housing 40. These manual actuator assemblies are also made to accurately and consistently position the device 50 in the X-axis and Y-axis so the leads 52 align over and make contact with the conductive elements of the housing 42. The conductive elements 42 then make contact with pads 61 of the circuit board 60. The functionality of this invention applies mainly to the relatively accurate device positioning along the Z-axis.

The device positioning for test is achieved by first inserting the device 50 inside the window 41 of the housing 40 so the device's leads 52 are facing the generally non-conductive housing's floor 43. The alignment window 41 is relatively tight against the device's body sides 51 so the leads 52 are aligned with the conductive elements tip 44 and makes contact. The opposite end 45 of these conductive elements 42 then makes contact with generally conductive pads 61 on the circuit board 60.

The device 50 is then pressed onto the housing 40 by a generally manual clockwise rotation of the knob 2, which is part of the thread member 9, and rotates said thread member 9 where the tip 10 pushes or retracts on the backside of the device 53 to generally stop onto the housing's floor 43 surface.

The cover component 20 is mechanically linked to the housing 40 to be able to clamp the device 50. This can be done by several methods. One structure is shown in FIG. 1 wherein the cover is linked to a pivoting latch 30 that rides on pivot pins and hooks under a ledge 46 in the housing 40. The latch hook 31 position is maintained by a spring force 23 installed inside holes 24, 25 between the cover 20 and the latch 30. The hinge link between the latch 30 and the cover component 20 is achieved by two dowel pins 21 installed between holes 26 of the cover's bosses 22.

The knob's 2 rotation is controlled by a dowel stop pin 7 installed generally on top of the cover component 20 and the wires 3 installed on top 16 of the knob 2. The associated claim of this invention relates to the provision for fine and flexible adjustment of the knob's start and stop rotation.

The stop involves an adjustable/removable member 3 placed in the knob 2 which engages a stop pin/post/flange/barrier 7 on the housing. The stop utilizes a wire 3 with a bend 11 similar to the letter "J" (FIG. 3). The side of the knob 2 has a pair of through holes (4, 15) one of which is located in an interference zone of the barrier 7 (when rotated) and the other of which (usually the inner holes 15) is always out of the way of dowel stop pin/barrier 7. Trough 6 is the one that is clear of barrier 7 so it does not interfere with the knob 2 rotation. The top 5 of hole 4 through which an end 12 of the wire 3 protrudes with its longer leg 12 in the interference path. This wire is inserted into two holes 4, 15 on top 16 of the knob 2 such that when the longer end 12 or 8 is inserted proximate the outer perimeter of the knob 2 the rotation of the knob 2 is limited by the location of the wire 3 due to the long end's 12/8 interference barrier 7 during rotation, in response to knob's 2 rotation. Conversely when the wire 3 is switched around such that the short end 13 in the holes 4, 15 is proximate the aforementioned outer perimeter of the knob 2 the rotation of the knob 2 will be not engage barrier 7. Barrier 7 is thus always located in the circumferential path of the outer hole 4 when a pin is placed to extend far engage the stop.

Of course, it is possible to use single leg pins, of sufficient length, but the double leg pins provide a storage system for the pin when not in use as a stop.

Additionally, if the knob 2 has additional hole pairs 4/15 at other locations around the top 16 of the knob 2 additional start and/or stop dowel stop pin adjustment locations are possible. Furthermore, if the end of the wire 12, 8 that engages with the dowel stop barrier 7 is bent towards or away from the said stop barrier 7, the start-and-stop locations can be even more finely adjusted. Even further, if the chosen diameter of the inserted wire 3 is more or less, the start-and-stop locations can be even more finely adjusted. A smaller diameter will allow further travel vs a larger. Therefore, the spacing of the hole pairs circumferentially around the knob and the wire diameter provide separate means of stop adjustment. Further the stop barrier could be adjustably mounted, such as on a screw adjuster to provide additional fine tune adjustment. These adjustments therefore limit the Z-translation of the thread member 9 to a range that is based on the location of the wires 3 and the pitch of the thread member 9.

These rotational stop adjustments can be easily accomplished by the user simply taking out the wire 3 from one dual-hole pair 4, 15 and reinstalling it into another to redefine new start-and-stop locations as desired. The number of hole pairs in the knob is only limited by the minimum thickness of walls between the holes. It also gives the user a means to visually verify the actual start-and-stop angle of the knob. The wire 3 is retained in the knob 2 by bending a sufficient angle 14 (FIG. 3) between the short 13 and long end 12 such that they create a small spring force to maintain the pin/wire in place thereby creating friction force due to the tendency of the wire's 3 ends to separate while inside the holes 4, 15.

The wire 3 can be a spring wire, or a low cost solid copper wire readily available in the market, therefore if the user loses the component the user can simply cut a compatible diameter wire, bend it, cut it usually with a pair of pliers and then reinsert it into the desired dual-hole 4, 15.

The manufacture of the knob 2 adjustment locations requires the simple general drilling of dual-hole pairs 4, 15.

Figure 5:
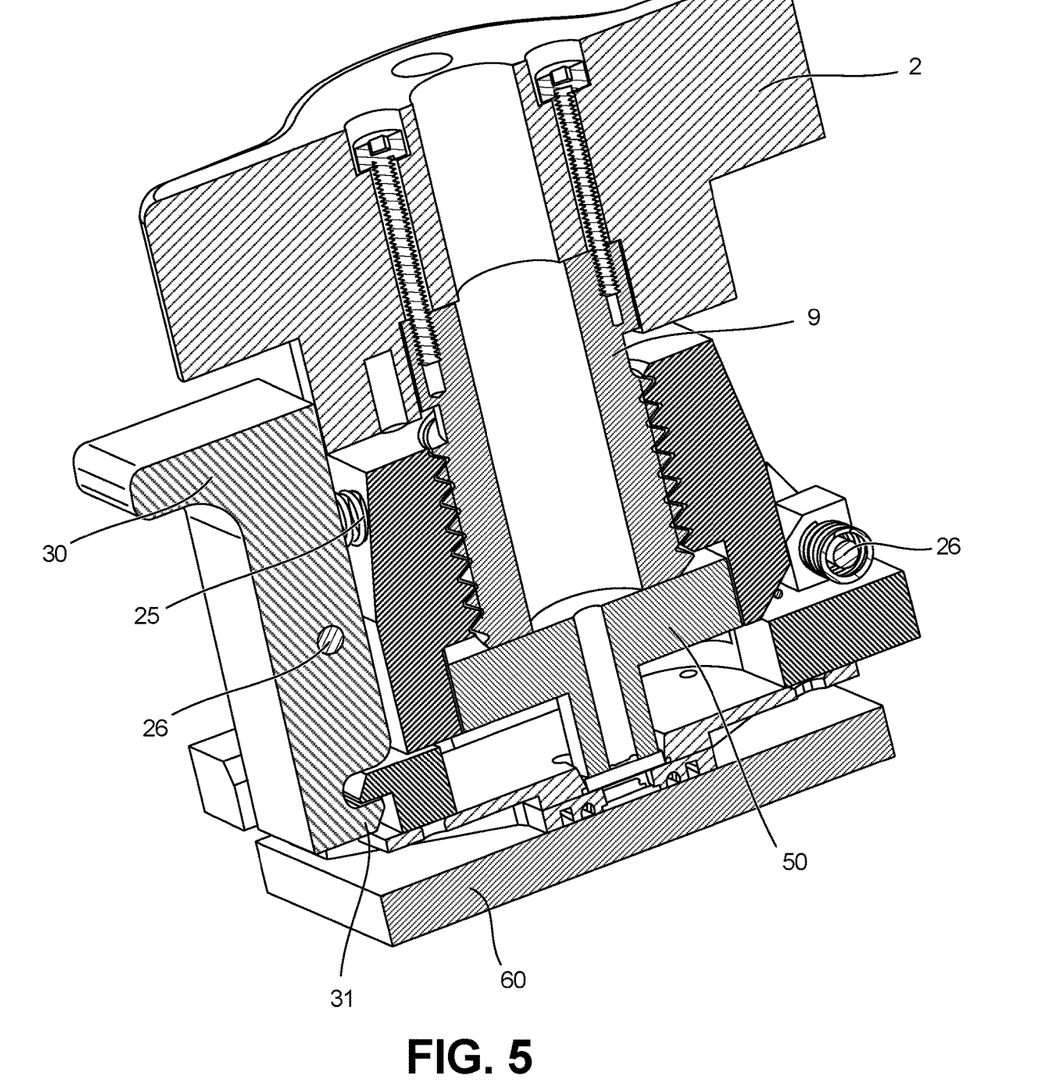
FIG. 5 is a view like FIG. 3 but of an alternative embodiment.
Figure 6:
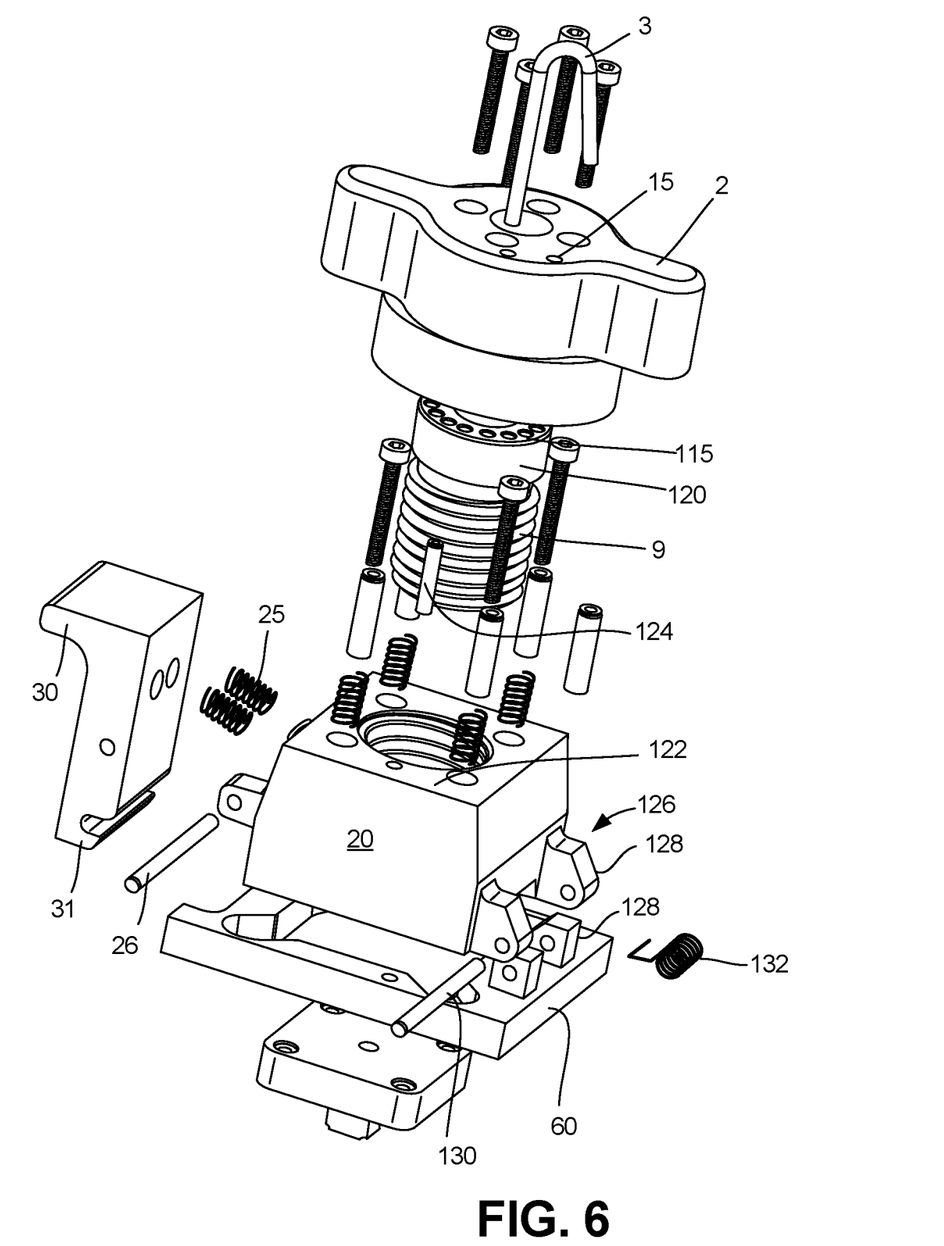
FIG. 6 is an exploded perspective view of FIG. 4.

FIGS. 4, 5 and 6 illustrate an alternate embodiment. To the extent that the elements are the same or similar, the same numerals have been used.

In this embodiment, instead of two hooks 31, there is a single hook and a pivot arrangement 126, with hinges 128 and a hinge pin 130 and a bias spring 132 which tends to open the cover. Cover component 20 therefore is tiltable on hinge arrangement 126 once pivoting latch 30 has been released. Leg 30 (FIG. 6) is a latching articulated leg, in that it can articulate along pivot pin 26 and on hinge pin 130.

Unlike the prior embodiment where the stop pin 7 engages wire 3, in this embodiment, wire 7 passes through holes 15 in the knob 2 to engage any of a plurality of holes 115 in ring 120. The ring may be fixed against rotation. Alternatively and similar to the first embodiment, stop pin 124 may be placed in hole 122 in the body and act as an interfering stop pin. Either way, the pin is inserted after the final predetermined pressure on the DUT has been reached. The pressure level has thus been set, so that when the DUT is removed and a new DUT is inserted cover 20 is pivoted into place, the same pressure will be applied.

The description of the invention and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

The invention claimed is:

1. A manually force adjustable integrated circuit tester for providing a force against a device under test (DUT) and a plurality of test pins for engaging DUT contacts, the tester comprising:

a) a frame having a housing sized to receive the device under test with a base surface against which the device under test is pressed, said base surface having housing contacts, said frame also including an upper portion;
b) said upper portion including a screw fed driver having a top toward its upper end and an engagement surface at its bottom end, the engagement surface configured to engage said device under test;
c) said frame having a receiver sized to receive the device under test and a bottom surface against which the device under test is pressed, said bottom surface having said contacts,
d) said screw fed driver having a knob,
e) a stop barrier operatively connected to the housing and located adjacent said knob;
f) said knob having an outer circumference and top surface, said top surface including a plurality of holes at least one of which extending through the knob;
g) at least one pin; so that when said knob is rotated, the pin follows a circumferential path under said knob;
h) said stop barrier being located to engage pin in said through hole along said path, when said knob is rotated and pin follows said path; thereby creating a stop engagement between said pin and said stop and thereby defining the maximum pressure on said DUT.

2. The tester of claim 1 wherein said pin holes include hole pairs are arranged in a path in said top of said knob forming concentric rings of holes, only the outer one aligned to interfere with said stop.

3. A tester according to claim 1, wherein said pin includes two spaced apart legs, said legs being spaced such that the pin can fit into a hole pair; the pin having a first longer leg long enough to extend through and beyond said knob.

4. The tester of claim 3 wherein said pins include a bend joining said legs.

5. The tester of claim 3 wherein said pin legs are parallel.

6. The tester of claim 3 wherein said pin legs are non-parallel to provide positive engagement with said holes.

7. The tester of claim 1 wherein said pins include pins of different diameters, less than diameter of said holes.

8. The tester of claim 1 wherein said stop barrier is movable.

9. The tester of claim 1 wherein said housing includes a top portion removable from a bottom portion said top portion including the screw fed driver and a pair of engagement arm which latch onto said bottom portion.

10. A manually force adjustable integrated circuit tester for providing a force against a device under test (DUT) and a plurality of test pins for engaging DUT contacts on the device under test, the tester comprising:
a) a frame having a housing sized to receive the device under test with a base surface against which the device under test is pressed, said base surface having said contacts, said frame also including an upper portion;
b) at least one latching articulated leg pivotally affixed to said upper portion and being engageable with said housing;
c) said upper portion including a screw fed driver having a top toward its upper end and an engagement surface at its bottom end, the engagement surface configured to engage said device under test;
d) a stop barrier operatively connected to the housing and located adjacent a knob;
e) said knob having an outer circumference and top surface, said top surface including a plurality of holes at least one of which extending through the knob;
f) at least one pin sized to be received in at least one hole;
g) said stop barrier being located to engage said longer pin in said through hole along said path, when said knob is rotated and said pin follows said path; thereby creating a stop engagement between said pin and said stop and thereby defining the maximum desired pressure on said device under test.

11. The tester of claim 10 wherein said upper portion further includes a hinge pivot opposite said latching articulated leg.

12. A method of setting the engagement pressure on a manually force adjustable integrated circuit tester for providing a force between screw driven element with a knob, driving a device under test (DUT) and housing floor having a plurality of test pins for engaging contacts on the device under test, having a plurality of through holes, at least one pin sized to be received within said holes, a stop barrier under said knob comprising the steps of:
a) inserting said pin in one of said holes such that said pin extends sufficiently that it will contact said stop barrier when said knob is rotated;
b) turning the knob to engage said stop barrier;
c) testing the electrical contact between the device under test and pins;
d) decreasing the contact pressure by turning the knob in a pressure releasing direction and simultaneously testing the electrical contact until it is no longer reliable;
e) increasing the contact pressure to at least a point of reliability;
inserting said pin in a hole adjacent said stop so that a reliable pressure is set.

13. A tester according to claim 3, wherein said barrier is located to engage said longer leg in said through hole along said path, when said knob is rotated and said longer leg follows said path; thereby creating a stop engagement between said longer leg and said stop and thereby defining the maximum desired pressure on said device under test.

14. The tester according to claim 10 wherein pin includes two spaced apart legs, said legs being spaced such that the pin can fit into a hole pair; the pin having a first longer leg long enough to extend through and beyond said knob; and wherein said stop barrier is located to engage said longer leg in said through hole along said when said knob is rotated and said longer leg follows said path; thereby creating a stop engagement between said longer leg and said stop and thereby defining the maximum desired pressure on said DUT.

* * * * *